United States Patent
Truong et al.

(10) Patent No.: US 10,111,338 B2
(45) Date of Patent: Oct. 23, 2018

(54) BUILD-UP HIGH-ASPECT RATIO OPENING

(71) Applicant: Intel Corporation, Santa Clara, CA (US)

(72) Inventors: Frank Truong, Gilbert, AZ (US); Dilan Seneviratne, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/464,123

(22) Filed: Mar. 20, 2017

(65) Prior Publication Data
US 2018/0270953 A1    Sep. 20, 2018

(51) Int. Cl.
H05K 3/06    (2006.01)
H05K 1/11    (2006.01)
H05K 1/09    (2006.01)
H05K 3/46    (2006.01)

(52) U.S. Cl.
CPC ............... *H05K 3/06* (2013.01); *H05K 1/09* (2013.01); *H05K 1/111* (2013.01); *H05K 1/116* (2013.01); *H05K 3/061* (2013.01); *H05K 3/068* (2013.01); *H05K 3/4644* (2013.01); *H05K 2201/0166* (2013.01); *H05K 2201/032* (2013.01)

(58) Field of Classification Search
CPC .......... H05K 3/02; H05K 3/022; H05K 3/025; H05K 3/027; H05K 3/06; H05K 3/061; H05K 3/062; H05K 3/064; H05K 3/065; H05K 3/067; H05K 3/068
See application file for complete search history.

(56) References Cited

U.S. PATENT DOCUMENTS

| | | | |
|---|---|---|---|
| 2009/0014207 A1* | 1/2009 | Takahashi | H05K 3/4602 174/266 |
| 2015/0156874 A1* | 6/2015 | Hasegawa | H05K 1/115 174/266 |

* cited by examiner

*Primary Examiner* — Jeremy C Norris
(74) *Attorney, Agent, or Firm* — Schwabe, Williamson & Wyatt, P.C.

(57) ABSTRACT

Embodiments herein relate to creating a high-aspect ratio opening in a package. Embodiments may include applying a first laminate layer on a side of a substrate, applying a seed layer to at least part of the laminate layer, building up one or more copper pads on the seed layer, etching the seed layer to expose a portion of the first laminate layer, applying a second laminate layer to fill in around the sides of one or more copper pads, and removing part of the buildup copper pads. Other embodiments may be described and/or claimed.

16 Claims, 8 Drawing Sheets

BUILD-UP HIGH-ASPECT RATIO OPENING

FIELD

Embodiments of the present disclosure generally relate to the field of package assemblies, and in particular package assemblies having high-aspect ratio openings.

BACKGROUND

The creation of high-aspect openings into packages, for example, within buildup dielectric and solder resist materials, in legacy implementations is performed by a laser process. However, as the thickness of these materials increases, for example, thicknesses above 50 μm (microns), it is more difficult using these legacy processes to create high-aspect ratio openings. In general, laser drilling approaches may have poorer accuracy compared to lithography equipment. Additionally, with respect to $CO_2$ and UV laser drilling process, a large heat affected zone surrounding the opening and removing smear at the bottom of the opening may further make creating high-aspect ratio openings difficult. For ultraviolet (UV) lasers, disadvantages may include a lower throughput to drill through greater than 50 μm of material, as well as damage to the copper pad underneath that may cause unintended re-deposition of copper on other surfaces.

DETAILED DESCRIPTION

Figure 1A:
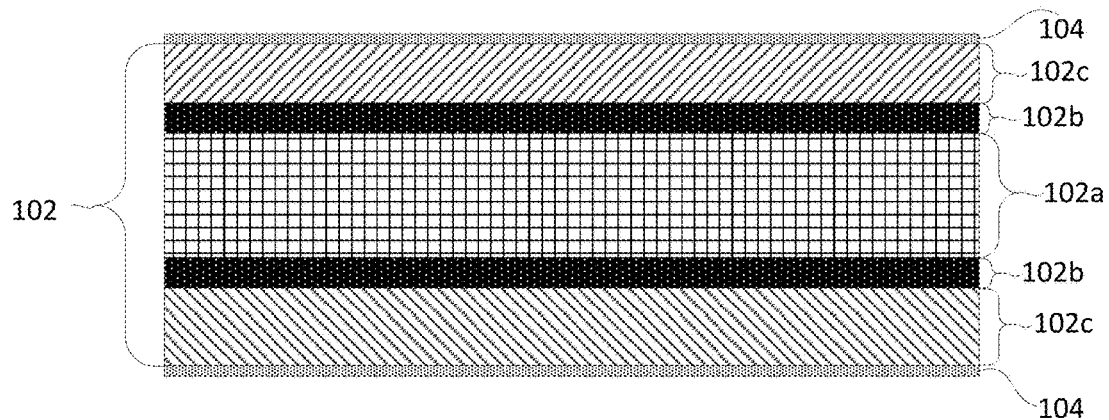
FIGS. 1A-1J illustrate an example of a package assembly at various stages of a manufacturing process, in accordance with embodiments.

Embodiments of the present disclosure may generally relate to creating one or more high-aspect ratio openings in buildup and/or solder resist materials. In embodiments, creations of high-aspect ratio openings may be applicable for manufacturing testing probe cards that are to receive pins from a die. In embodiments, determining whether an opening has a high-aspect ratio may include evaluating the ratio of a depth of the opening in comparison with the diameter of the opening, and comparing the ratio to a threshold value. In embodiments, a high-aspect ratio may include a depth of approximately 20 μm or greater having an aspect ratio of one to one or greater. In embodiments, the aspect ratio may include 2 to 1 or 5 to 1. In embodiments, the aspect ratio may also be determined by the dimensions of the opening, the surface area at the bottom of the opening, and the like. In embodiments, a feature of a high aspect ratio opening may include a minimum taper of the sides of the opening. For example, a taper of zero may indicate that the walls of the opening are vertical or nearly vertical or that the top of the opening is roughly equal size to the bottom of the opening In embodiments, sidewalls of the high-aspect ratio opening may be smooth or substantially smooth, and in embodiments may have uniform roughness.

In embodiments, the process may include creating a high-aspect ratio via, which in embodiments may be referred to as a tall via, using a self-aligned via process in combination with subsequent etching. In embodiments, As a result, high-aspect ratio openings may be created with an accuracy found in legacy lithography processes used to create shorter vias. In embodiments, this process may be beneficial for enabling next-generation probe cards where tighter bump pitches, for example, less than 100 μm, may require increased aspect ratios. In embodiments, a bump pitch may be the spacing between bumps where physical connections may be made between substrates and chips. In embodiments, bumps may be created using solder ball reflowing in a flip chip manufacturing process, or during copper pillar connections.

In embodiments, using a self-aligned via process, tall copper pillars, for example, greater than 50 μm, may be created using self-aligned printing (SAP) lithography techniques. In embodiments, these tall copper pillars may be laminated over using a thick buildup dielectric material or solder resist material. In embodiments, after lamination, etching may be performed to remove all or part of the copper pillars to leave high-aspect ratio openings in the buildup material. In embodiments, a high-aspect ratio opening in a semiconductor package may be used as a pin socket. In embodiments, the high-aspect ratio opening may be used for pin insertion.

In embodiments, the process may include applying a first layer of dry film resist (DFR) that may be used to create the underlying copper pads for connection, and apply etch stop to the copper pads. The first layer of DFR may be applied with a hot roll lamination process. Subsequently, the first layer of DFR may be stripped away. A second layer of DFR may be applied using a vacuum lamination process, since DFR may tent over a non-uniform topology, making it more difficult to plate without defects. From the second exposed DFR pattern, another copper layer, which may take the form of a pillar, would be plated. The distance between the top of this copper pillar and down to the etch stop may define a high-aspect ratio via. Everything from the second layer DFR may be etched away, everything from the first layer DFR may stay in the final product, except for removal of the etch stop layer. In embodiments, instead of DFR, liquid photo resist may be used.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent. In embodiments, operations may be skipped or may be performed multiple times.

As used herein, the term "module" may refer to, be part of, or include an ASIC, an electronic circuit, a processor (shared, dedicated, or group) and/or memory (shared, dedicated, or group) that execute one or more software or firmware programs, a combinational logic circuit, and/or other suitable components that provide the described functionality.

Various figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIGS. 1A-1J illustrate an example of a package assembly at various stages of a manufacturing process, in accordance with embodiments. In embodiments, one or more elements may be introduced in an earlier figure, for example, FIG. 1A, and then assumed to carry over to later Figures, such as FIG. 1B. Therefore, each and every element of the package assembly may not be labeled in each and every stage of FIGS. 1A-1J for the sake of clarity and the ease of understanding.

Specifically, FIG. 1A shows a package assembly embodiment with a substrate layer 102 that may include a substrate core 102a. In embodiments, the substrate core 102a may include a glass-fiber reinforced core material. In embodiments, the substrate core 102a may be referred to as a copper clad laminate. In embodiments (not shown), layer 102 may be a core-less structure that may use a sacrificial carrier that may be separated at a later point in the package assembly process. The substrate layer 102 may also include a copper layer 102b, and/or a film layer 102c. In embodiments, the copper layer 102b may be a layer of some other metal and/or alloy. In embodiments, the film layer 102c, which may also be referred to as a laminate layer, may be a buildup dielectric film (BUF), such as a photoimageable dielectric, or a solder resist (SR) layer.

In embodiments, a seed layer 104 may be applied to the film layer 102c. The seed layer 104 may be copper, a thin film of titanium followed by a thin layer of copper, a copper alloy, or some other appropriate material. In embodiments, the seed layer 104 may be applied through an electroless copper process or a sputtered process. In embodiments, the seed layer 104 may be applied through some other process. In embodiments, the seed layer 104 may be a BUF material with copper foil laminated onto the BUF material. Such embodiments may have advantages when applied to materials that may have poor interactions with electroless or sputtered plating processes.

Also, it should be appreciated that while FIGS. 1A-1J may illustrate buildup layers on either side of substrate layer 102, embodiments of this process may be applied to just one side of a substrate layer 102.

Figure 1B:
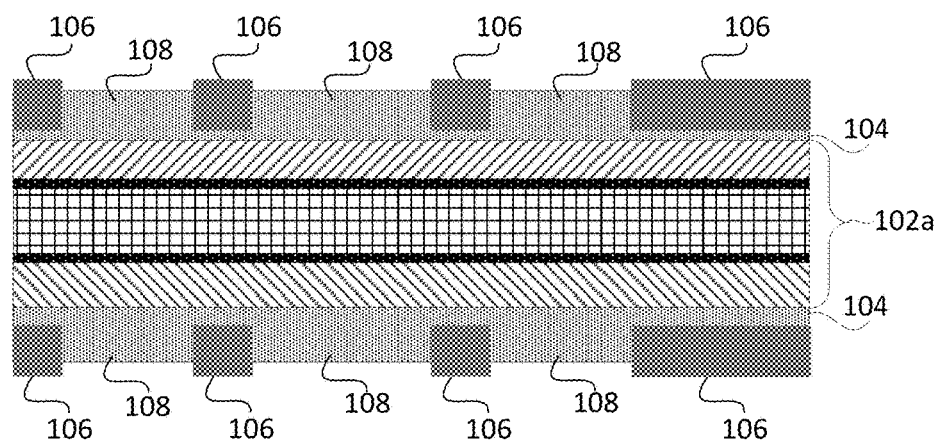

FIG. 1B illustrates a package assembly embodiment that may include a DFR layer 106 on the seed layer 104. In embodiments, the DFR may be a positive resist, where exposure to light may cause the DFR to become soluble, or the DFR may be a negative resist, where exposure to light may cause the DFR to become insoluble. In embodiments, when the DFR becomes soluble it may be removed by washing with an aqueous or other solution. In embodiments, the DFR layer 106 may be created by a lithographic process that may use a mask to identify the areas on which the DFR layer 106 may be placed. In embodiments, a liquid photo resist (LPR) may be used instead of DFR. In embodiments, the seed layer 104 may also include LFR.

In embodiments, subsequent to the placement of the DFR 106, a copper layer, for example, may be used to create copper pads 108. In embodiments, copper pads may be created using a copper plating process. In embodiments, nickel, tin, and/or gold may be used, or some other suitable metal and/or alloy may be applied. In embodiments, the metal and/or alloy may be applied through an electroless or electrolytic deposition process.

Figure 1C:
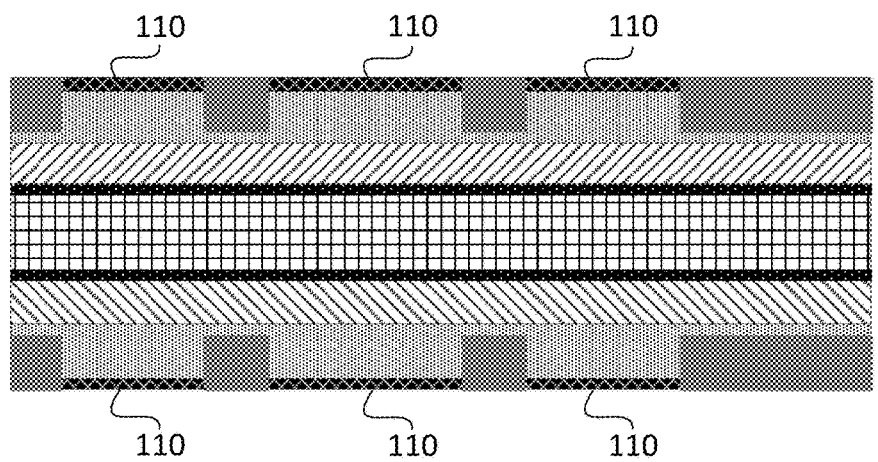

FIG. 1C illustrates a package assembly embodiment wherein etch stop layer 110 may be deposited. In embodiments, the etch stop layer 110 may be an electrolytic nickel applied onto the copper pad as described above for FIG. 1B. In embodiments, the etch stop layer 110 may be one of several etch stops (not shown) on multiple layers of copper pads (not shown) that may be used to define the depth of the high-aspect ratio opening or tall via. In embodiments, the etch stop layer 110 may be made of some other material, and may be applied through some other process.

Figure 1D:
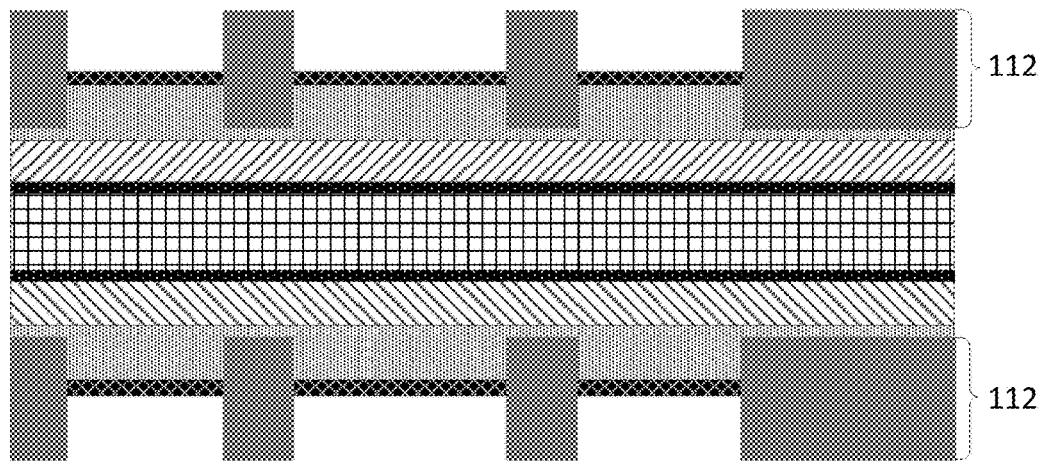

FIG. 1D illustrates a package assembly embodiment wherein a DFR layer 112 may replace the existing DFR layer 106 of FIG. 1B. In embodiments, the DFR layer 106 of FIG. 1B may be removed using a solvent, as described below, and a new DFR layer 112 may be added using a process similar to the lithographic process described with respect to FIG. 1B. In embodiments, the DFR layer 112 may be created by adding an additional layer of DFR onto the existing DFR layer 106 of FIG. 1B. The additional layer of DFR may be applied using a vacuum lamination process. DFR may usually tent over a non-uniform topology which may make it more difficult to plate without defects. These and other embodiments may be further described in FIG. 2.

Figure 1E:
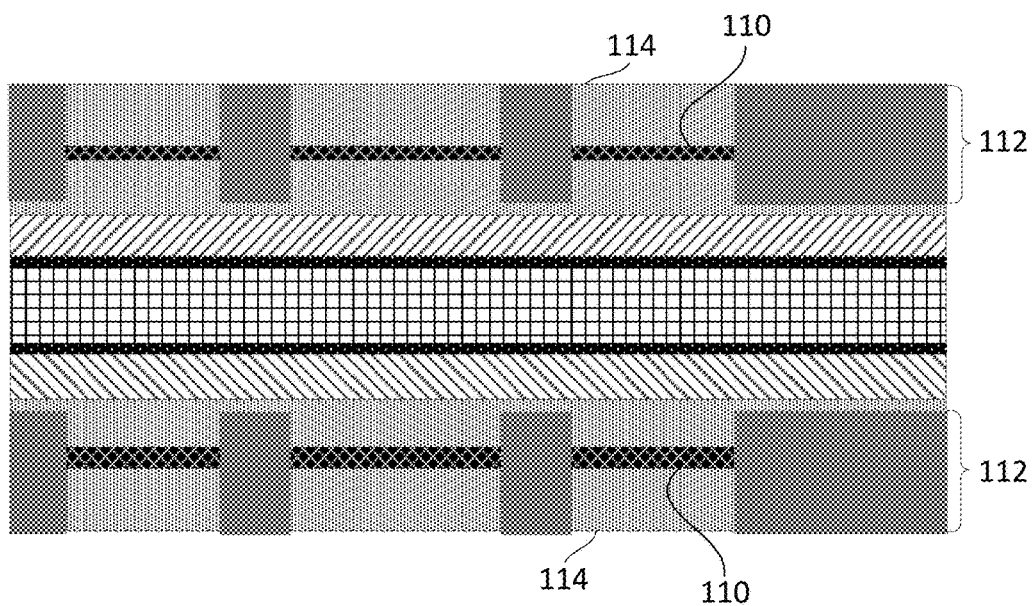

FIG. 1E illustrates a package assembly embodiment wherein a second layer of copper 114 may be deposited above the etch stop layer 110. In embodiments, the copper 114 may be deposited in a fashion similar to copper pads 108 of FIG. 1B.

Figure 1F:
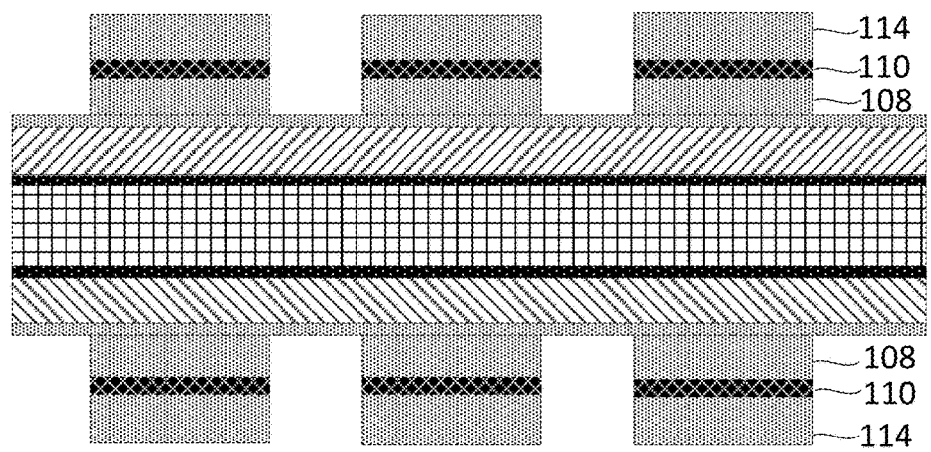
Figure 2:
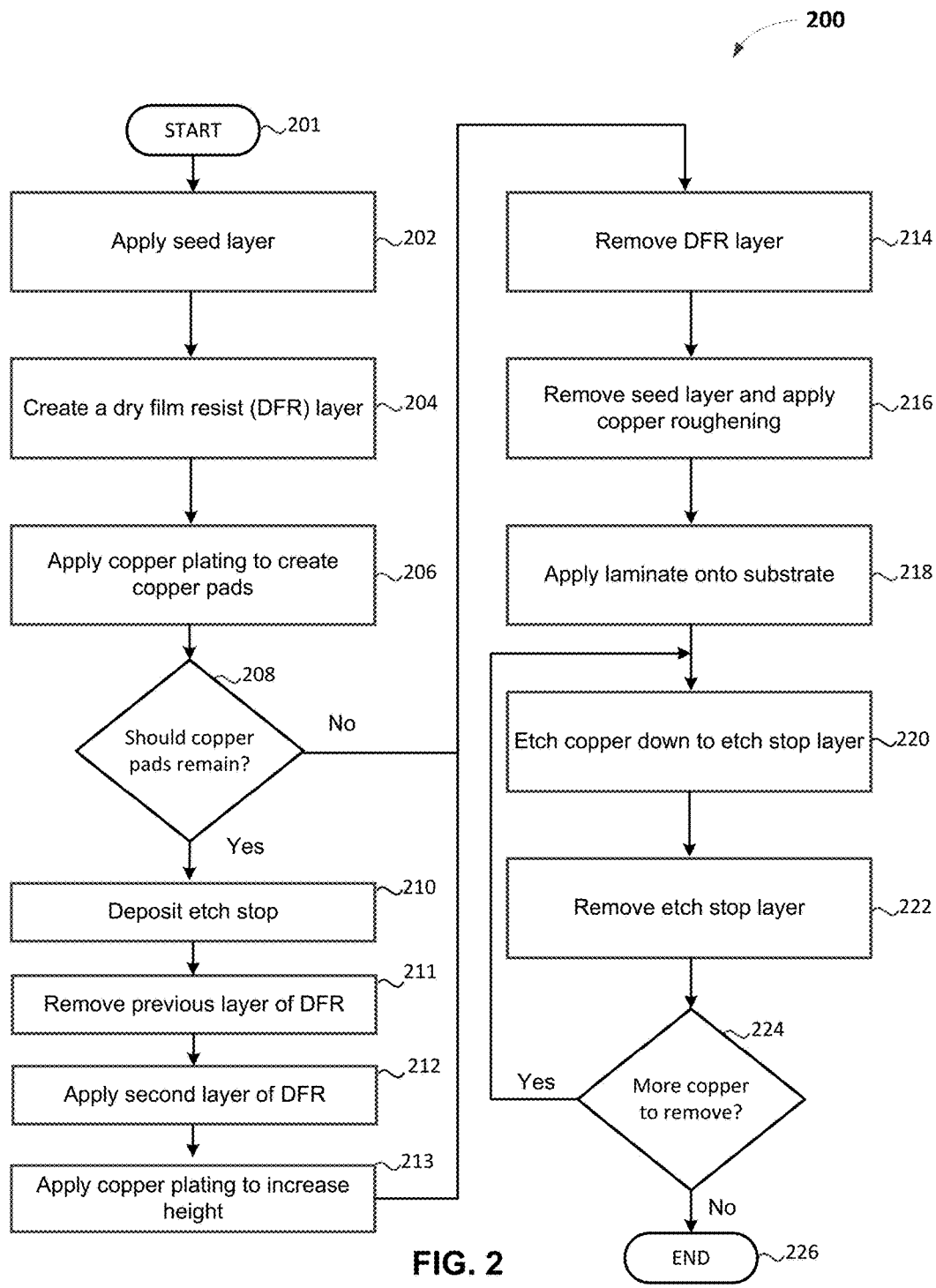
FIG. 2 illustrates an example of a process for manufacturing a package assembly, in accordance with embodiments.

In embodiments, as may be described in FIG. 2, the actions described in FIGS. 1D and 1E may be repeated to build up increasingly taller stacks of copper pads interleaved with etch stops, for example, 108, 110, 114 of FIG. 1F.

FIG. 1F illustrates a package assembly embodiment wherein the DFR layer 112 of FIG. 1E may be removed. In embodiments, there may be additional layers of DFR (not shown) that may be removed. In embodiments, the DFR may be removed by a solvent such as dimethyl sulfide oxide (DMSO), N-Methyl-2-pyrrolidone (NMP) or tetramethylammonium hydroxide (TMAH) to break down covalent bonds in the DFR.

Figure 1G:
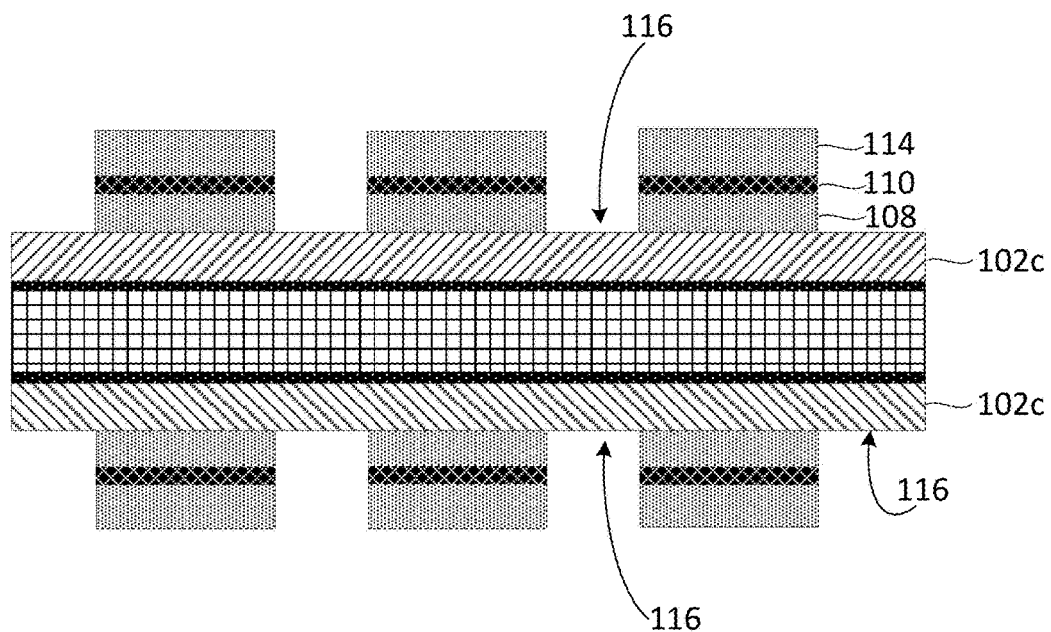

FIG. 1G illustrates a package assembly embodiment wherein portions of the seed layer 116 that may be adjacent to the substrate layer 102 may be removed. In embodiments, the seed layer 116 may be adjacent to the film layer 102c. In embodiments, this removal may be done so that the lamination layer 118 in FIG. 1H may bond directly to the film layer 102c. In embodiments, the removal may be accomplished through etching, or through some other suitable process.

Figure 1H:
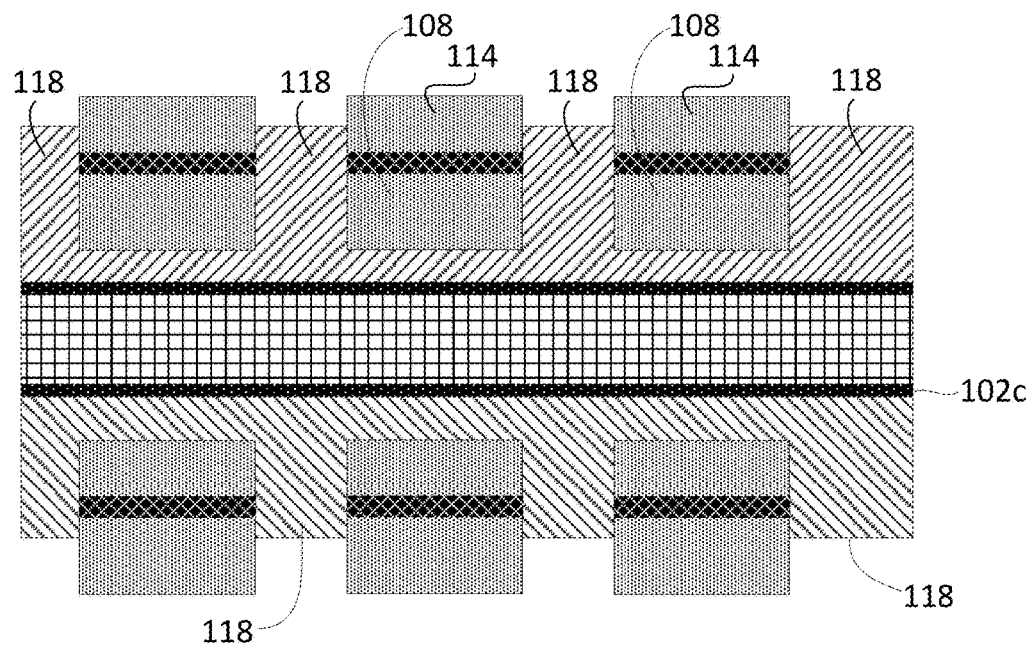

FIG. 1H illustrates a package assembly embodiment wherein a lamination layer 118 may be applied. In embodiments, lamination layer 118 may be the same or similar to the film layer 102c. In embodiments, the laminate of the lamination layer 118 may be a dielectric that is applied over the package in a process that may force the dielectric down between the stacked copper pads 108, 114. In embodiments, a special film (not shown) of a flexible material may be used to push down on the lamination layer 118, which may force the lamination layer 118 between the stacked copper pads 108, 114. In embodiments, the lamination layer 118 may be pressed in between the stacked copper pads 108, 114 such that the surface of the lamination layer 118 may be at or below the height of the stacked copper pads 108, 114. In other embodiments, the lamination layer 118 may be applied such that it covers the stacked copper pads 108, 114. In these embodiments, the lamination layer 118 may be subject to a grinding process or otherwise moved to expose the copper of the stacked copper pad 114.

Figure 1I:
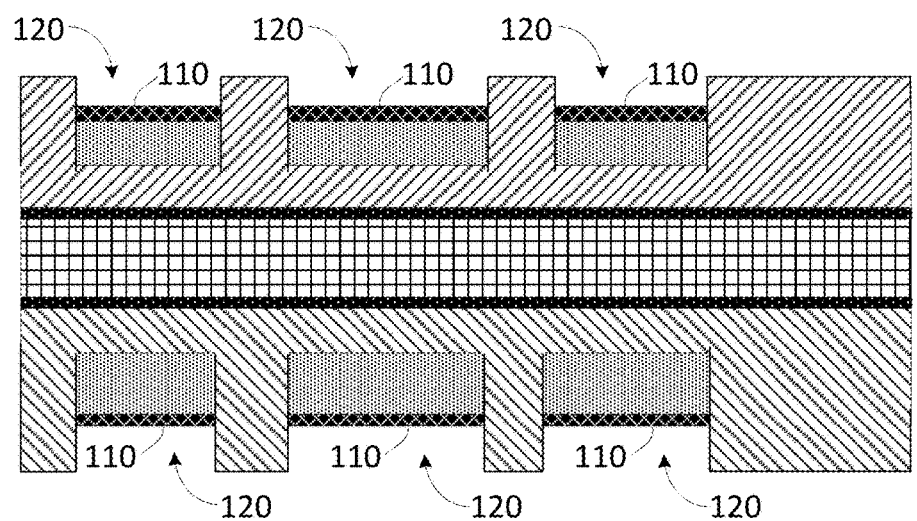

FIG. 1I illustrates a package assembly embodiment wherein the stacked copper pad 114 may be etched away, leaving opening 120. In embodiments, the etching may proceed to the etch stop layer 110.

Figure 1J:
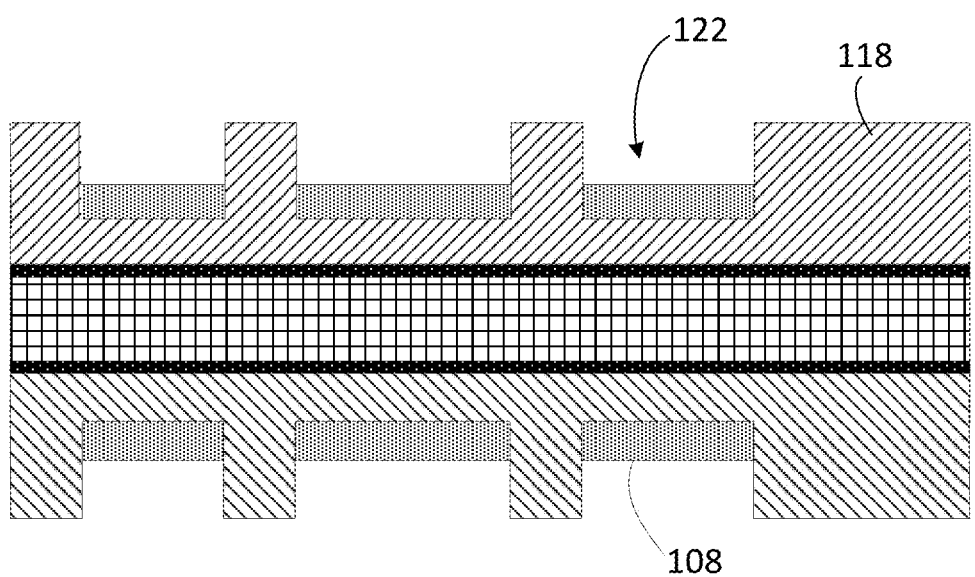

FIG. 1J illustrates a package assembly embodiment wherein the etch stop layer, which may be the same as etch stop layer 110 of FIG. 1I, is removed. In embodiments this process may result in high-aspect ratio openings 122 in the lamination layer 118. In other embodiments, the copper pads 108 may be etched away (not shown).

In embodiments, which may be described in FIG. 2, the actions described with respect to FIGS. 1I and 1J may be repeated to incrementally remove the stacks of copper pads interleaved with etch stops, for example, 108, 110, 114 of FIG. 1F.

FIG. 2 illustrates an example of a process 200 for manufacturing a package assembly, such as the package assembly or portions of the package assembly as shown in FIGS. 1A-1I, in accordance with embodiments.

At block 201, the process may start.

At block 202, the process may include applying a seed layer. In embodiments, the seed layer may be similar to seed layer 104 of FIG. 1A, and may be applied to a surface that may be similar to the surface of substrate layer 102 of FIG. 1A. In embodiments, the substrate layer 102 may include a number of layers, for example, copper layers below a middle layer and above a substrate core 102a, which may be separated by one or more dielectric layers and/or film layers 102c, and one or more copper layers 102b. In embodiments, as referenced above, layer 102 may be a core-less structure without a substrate core 102a that may use a sacrificial carrier that is separated at a later point in the package assembly process. In embodiments, the seed layer 104 application may be accomplished through a deposition. The deposition may be performed using a traditional wet process or a dry process, depending upon the material onto which the seed layer 104 is deposited. In embodiments, the seed layer 104 may be a BUF material that may include a copper foil laminated onto the BUF material, as described above.

At block 204, the process may include applying a DFR layer on the seed layer. In embodiments, the DFR layer may be similar to DFR layer 106 and the seed layer similar to seed layer 104 of FIG. 1B. In embodiments, the DFR layer 106 may be applied using a first layer lithography process. In embodiments, this DFR layer 106 may be used to subsequently create the underlying copper pads for connection and may be used to facilitate applying etch stop. In embodiments, the DFR layer 106 may be applied with a hot roll lamination process. In embodiments, the DFR layer 106 may be of varying thicknesses, which may be varied to allow varying thickness of copper plating, as described below at block 206.

At block 206, the process may include applying copper plating to create copper pads. In embodiments, the copper pads may be similar to copper pads 108 of FIG. 1B.

At block 208, the process may determine whether copper pads remain. In embodiments, this determination may be based on whether the bottom of the high-aspect opening is to have a copper pad 108 at the bottom, as may be shown in FIG. 1J. If no, then the process may proceed to block 214.

If yes, then at block 210, the process may include depositing an etch stop. The etch stop may be similar to etch stop layer 110 of FIG. 1C. In embodiments, the etch stop layers 110 may be deposited on the copper pads 108. In embodiments, the etch stops may include electrolytic nickel, silica nitride, or titanium.

At block 211, the process may include removing the previous layer of DFR. In embodiments, this may remove the DFR placed at block 204, which may refer to DFR 106 of FIG. 1B. In embodiments, the DFR may be removed using a solvent, such as DMSO, NMP or TMAH.

At block 212, the process may include applying a second layer of DFR. In embodiments, the second layer of DFR may be applied using a vacuum lamination process. In embodiments, the DFR layer may be similar to DFR layer 112 of FIG. 1D. In embodiments, a DFR layer may be applied, and then a lithography process may be used to create openings in the DFR. In embodiments, the DFR may be placed on the seed layer 104, or on top of existing DFR material, such as DFR layer 106 of FIG. 1B if that layer has not been previously removed as described in block 211. In embodiments, the second DFR layer, such as DFR layer 112 of FIG. 1D, may be added using a process similar to the lithographic process described with respect to FIG. 1B.

At block 213, the process may include applying copper plating to increase the height of the copper stacks. In embodiments, the height of the copper stacks, for example 108, 110, 114 of FIG. 1F may determine the depth of the high-aspect ratio opening.

In embodiments, repeating blocks 210-213 of this process may allow for creation of additional layers of copper plating and/or etch stop to be applied in order to increase the height of the copper stack, and consequently a taller-aspect ratio opening.

At block 214, the process may include removing the DFR layer. In embodiments, the DFR layer may be removed using a solvent, such as DMSO, NMP or TMAH. In embodiments, the DFR layer may include the DFR layer 106 of FIG. 1B, the DFR layer 112 of FIG. 1D, and/or other applied DFR layers (not shown).

At block 216, the process may include removing the seed layer between the copper pad stacks. In embodiments, the removed seed layer may be similar to the removed seed layer 116 of FIG. 1G. In embodiments, the copper stacks may include the copper stack including 108, 110, 114 of FIG. 1G. In embodiments, the seed layer may be removed by etching. In embodiments, exposed copper may be roughened to better enable adhesion between copper and BUF interfaces. In embodiments, adhesion may be chemically enhanced by applying a bifunctional molecule, having one end with a high affinity to copper and another end that reacts with chemical groups in BUF.

At block 218, the process may include applying lamination onto the substrate. In embodiments, the lamination layer may be similar to the lamination layer 118 in FIG. 1H. In embodiments, the lamination layer may include a thick layer of BUF, SR material, or some other dielectric that may be applied over the copper stacks, which may be similar to the copper stacks 108, 110, 114 of FIG. 1G. In embodiments, applying lamination may refer to a vacuum lamination process, which may use a vacuum to remove air and then may use a rubber pad mounted on a stainless steel plate or an air bladder to press the laminate onto the substrate. In embodiments, a second press with a flat stainless steel plate may be used to planarize the lamination material to a uniform surface. In embodiments, when the layers of copper pads and etch stop, as discussed below, are removed, the resulting high-aspect openings 122 will have sides formed by the lamination layer 118. In embodiments, the thickness of the lamination layer may fall below the height of the copper stacks, which may be similar to the copper stacks 108, 110, 114 of FIG. 1F, exposing the top of the copper stacks.

In embodiments, the lamination layer 118 may be applied over the entire surface of the package (not shown), and etching and/or mechanical grinding techniques may be applied to the lamination layer to expose the copper stacks.

At block 220, the process may include etching copper down to an etch stop layer. In embodiments, this may create an opening in the lamination layer 118, such as opening 120 of FIG. 1I.

At block 222, the process may include removing the etch stop layer. In embodiments, the etch stop may be removed by an etching process. In embodiments, the etch stop layer may be the same as etch stop layer 110 of FIG. 1I.

At block 224, the process may determine whether more copper is to be removed. If yes, then the process may proceed to block 220. If no, the process may end at block 226. In embodiments, the result may be a high-aspect ratio opening within the dielectric material of the lamination layer. In embodiments, the bottom of the opening may include a copper pad such as copper pad 108 of FIG. 1J.

Figure 3:
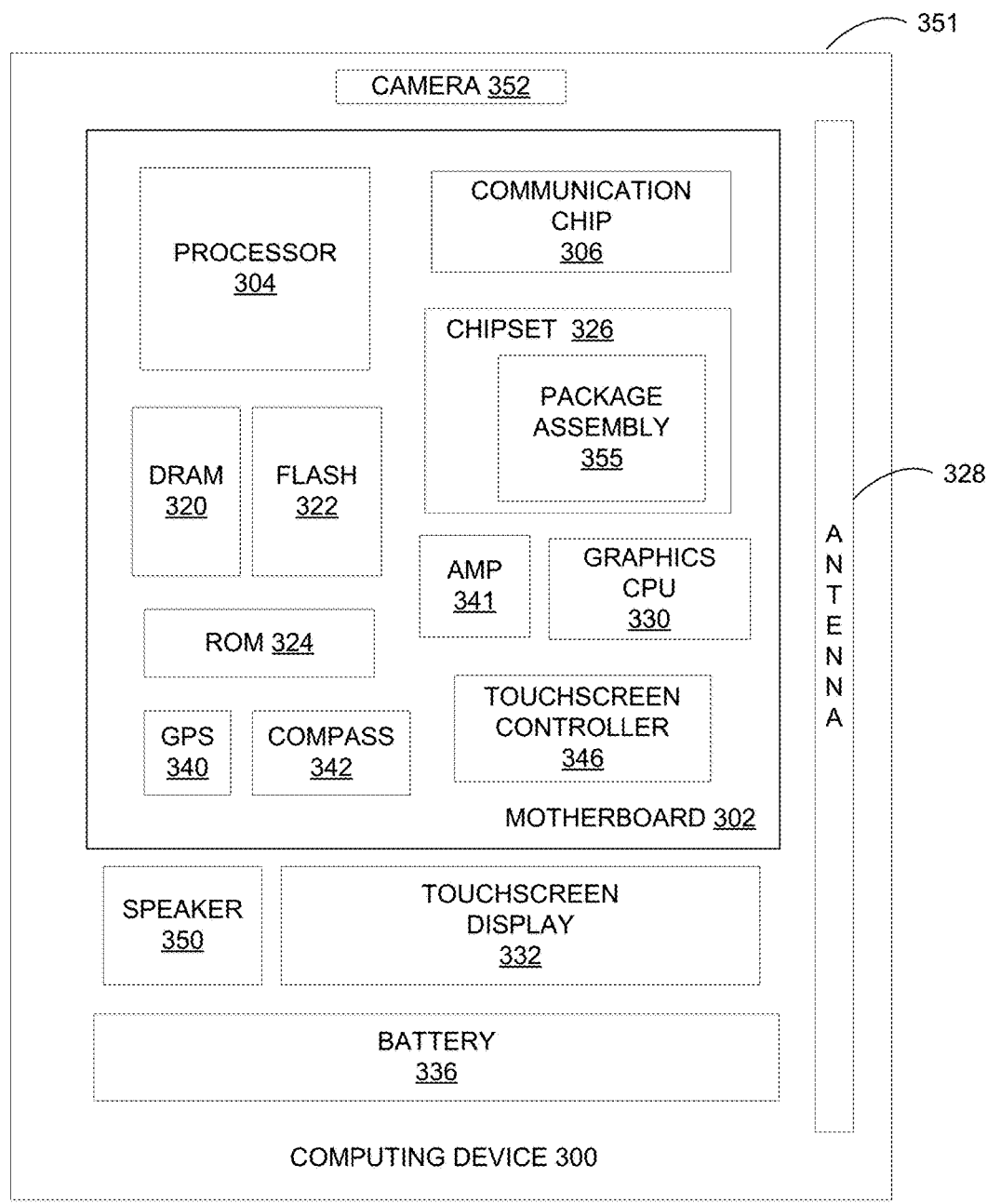
FIG. 3 schematically illustrates a computing device, in accordance with embodiments.

FIG. 3 schematically illustrates a computing device, in accordance with embodiments. Embodiments of the present disclosure may be implemented into a system using any suitable hardware and/or software to configure as desired. The computing device 300 may house a board such as motherboard 302 (i.e., housing 351). The motherboard 302 may include a number of components, including but not limited to a processor 304 and at least one communication chip 306. The processor 304 may be physically and electrically coupled to the motherboard 302. In some implementations, the at least one communication chip 306 may also be physically and electrically coupled to the motherboard 302. In further implementations, the communication chip 306 may be part of the processor 304.

Depending on its applications, computing device 300 may include other components that may or may not be physically and electrically coupled to the motherboard 302. These other components may include, but are not limited to, volatile memory (e.g., DRAM) 320, non-volatile memory (e.g., ROM) 324, flash memory 322, a graphics processor 330, a digital signal processor (not shown), a crypto processor (not shown), a chipset 326, an antenna 328, a display (not shown), a touchscreen display 332, a touchscreen controller 346, a battery 336, an audio codec (not shown), a video codec (not shown), a power amplifier 341, a global positioning system (GPS) device 340, a compass 342, an accelerometer (not shown), a gyroscope (not shown), a speaker 350, a camera 352, and a mass storage device (such as hard disk drive, compact disk (CD), digital versatile disk (DVD), and so forth) (not shown). Further components, not shown in FIG. 3, may include a microphone, a filter, an oscillator, a pressure sensor, or an RFID chip. In embodiments, one or more of the package assembly components 355 may be a package assembly such as the package assembly shown in FIG. 1I.

The communication chip 306 may enable wireless communications for the transfer of data to and from the computing device 300. The term "wireless" and its derivatives may be used to describe circuits, devices, systems, processes, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 306 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 306 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 306 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 306 may operate in accordance with other wireless protocols in other embodiments.

The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, EV-DO, and others.

The processor 304 of the computing device 300 may include a die in a package assembly such as, for example, one of package assemblies of FIG. 1I, or any other package assembly using thermal coupling with through mold vias as described herein. The term "processor" may refer to any device or portion of a device that processes electronic data from registers and/or memory to transform that electronic data into other electronic data that may be stored in registers and/or memory.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, a solid-state hard drive, an entertainment control unit, a digital camera, a portable music player, or a digital video recorder. In further implementations, the computing device 300 may be any other electronic device that processes data, for example, an all-in-one device such as an all-in-one fax or printing device.

The following paragraphs describe examples of various embodiments.

Example 1 may be a package comprising: a substrate; a laminate coupled to the substrate; a high-aspect ratio openings in the laminate, wherein the high-aspect ratio opening has an aspect ratio greater than 1:1 and an opening depth greater than 20 micrometers (μm).

Example 2 may include the package of example 1, wherein the aspect ratio is approximately 2:1 or the aspect ratio is approximately 5:1.

Example 3 may include the package of example 1, wherein a sidewall of the high-aspect ratio opening is vertical or substantially vertical.

Example 4 may include the package of example 1, wherein a taper of a sidewall of the high-aspect ratio opening has a taper of zero or substantially zero.

Example 5 may include the package of example 1, wherein a sidewall of the high-aspect ratio opening has a uniform roughness.

Example 6 may include the package of any examples 1-5, wherein a bottom of the high-aspect opening is copper.

Example 7 may include the package of any examples 1-5, wherein the laminate is a buildup dielectric film (BUF) or a solder resist (SR) layer.

Example 8 may include the package of any examples 1-5, wherein the high-aspect ratio opening is a plurality of high-aspect ratio openings.

Example 9 may include the package of any one of examples 1-5, wherein the high-aspect ratio opening is to receive a pin from a die.

Example 10 may be a method for creating a package, comprising: applying a first laminate layer on a side of a substrate; applying a seed layer to at least part of the laminate layer; building up one or more copper pads on the seed layer; etching at least a portion of the seed layer to expose a portion of the first laminate layer; applying a second laminate layer to the side of the substrate, the second laminate layer to fill in around sides of at least one of the one or more copper pads and to couple with at least a portion of the exposed first laminate layer; and removing at least part of the built-up one or more copper pads to create at least one opening in the second laminate layer wherein the at least one opening is a high-aspect ratio opening, wherein the high-aspect ratio opening has an aspect ratio greater than 1:1 for opening depths greater than 20 micrometers (μm).

Example 11 may include the method of example 10, wherein the aspect ratio is approximately 2:1 or the aspect ratio is approximately 5:1.

Example 12 may include the method of example 10, wherein building up one or more copper pads on the seed layer includes: applying a dry film resist (DFR) layer or a liquid photo resist (LPR) layer to the seed layer; forming one or more copper pads onto the seed layer or onto an existing one or more copper pads, wherein one of the formed one or more copper pads includes an etch stop layer on the surface of the one of the formed one or more copper pads; and removing the one or more applied DFR layers or the one or more applied LPR layers.

Example 13 may include the method of example 10, wherein building up one or more copper pads on the seed layer includes: applying a DFR layer to an existing DFR layer or an LPR layer to an existing LPR layer; forming one or more copper pads onto the seed layer or onto an existing one or more copper pads, wherein one of the formed one or more copper pads includes an etch stop layer on the surface of the one of the formed one or more copper pads; and removing the one or more applied DFR layers or the one or more applied LPR layers.

Example 14 may include the method of any examples 10-12, wherein removing at least part of the built-up one or more copper pads to expose at least one opening in the second laminate layer further includes etching the built-up one or more copper pads to the etch stop layer.

Example 15 may include the method of example 14, further comprising removing the etch stop layer.

Example 16 may include the method of any examples 10-12, wherein the first or second laminate layer is a buildup dielectric film (BUF) layer or a solder resist (SR) layer.

Example 17 may include the method of any examples 10-12, wherein the seed layer comprises a copper, tin and copper, or copper alloy film.

Example 18 may include the method of any one of examples 10-12, wherein the seed layer is applied through an electroless plating process or a sputter process.

Example 19 may include the method of any one of examples 10-12, wherein the substrate is a high-density interconnect substrate.

Example 20 may include the method of any one of examples 10-12, wherein the substrate is a core-less substrate.

Example 21 may include the method of any one of examples 10-12, wherein to create at least one opening in the second laminate layer further includes to create at least one opening having a height of at least approximately 30 microns μm and a diameter smaller than approximately 50 μm.

Example 22 may include the method of any one of examples 10-12, wherein to create at least one opening in the second laminate layer further includes to create at least one high aspect ratio opening for pin insertion.

Example 23 may include the method of any one of examples 10-12, wherein to create at least one opening in the second laminate layer further includes to create at least one pin socket.

Example 24 may be a device comprising: means for applying a first laminate layer on a side of a substrate; means for applying a seed layer to at least part of the laminate layer; means for building up one or more copper pads on the seed layer; means for etching the seed layer not covered by the one or more copper pads to expose a portion of the first laminate layer; means for applying a second laminate layer to the side of the substrate, the second laminate layer to fill in around the sides of at least one of the one or more copper pads and to couple with at least a portion of the exposed first laminate layer; and means for removing at least part of the built-up one or more copper pads to create at least one opening in the second laminate layer to create a high-aspect ratio opening with an aspect ratio greater than 1:1 for opening depths greater than 20 micrometers (μm).

Example 25 may include the device of example 24, wherein the aspect ratio is approximately 2:1 or the aspect ratio is approximately 5:1.

Example 26 may include the device of example 24, wherein building up one or more copper pads on the seed layer includes: means for applying a dry film resist (DFR) layer or a liquid photo resist (LPR) layer to the seed layer; means for forming one or more copper pads onto the seed layer or onto an existing one or more copper pads, wherein one of the formed one or more copper pads includes an etch stop layer on the surface of the one of the formed one or more copper pads; and means for removing the one or more applied DFR layers or the one or more applied LPR layers.

Example 27 may include the device of example 24, wherein building up one or more copper pads on the seed layer includes: means for applying a DFR layer to an existing DFR layer or an LPR layer to an existing LPR layer; means for forming one or more copper pads onto the seed layer or onto an existing one or more copper pads, wherein one of the formed one or more copper pads includes an etch stop layer on the surface of the one of the formed one or more copper pads; and means for removing the one or more applied DFR layers or the one or more applied LPR layers.

Example 28 may include the device of any one of examples 24-26, wherein means for removing at least part of the built-up one or more copper pads to expose at least one opening in the second laminate layer further includes means for etching the built-up one or more copper pads to the etch stop layer.

Example 29 may include the device of example 28, further comprising means for removing the etch stop layer.

Example 30 may include the device of any one of examples 24-27, wherein the first or second laminate layer is a buildup dielectric film (BUF) layer or a solder resist (SR) layer.

Example 31 may include the device of any one of examples 24-27, wherein the seed layer comprises a copper, tin and copper, or copper alloy film.

Example 32 may include the device of any one of examples 24-27, wherein the seed layer is applied through an electroless plating process or a sputter process.

Example 33 may include the device of any one of examples 24-27, wherein the substrate is a high-density interconnect substrate.

Example 34 may include the device of any one of examples 24-27, wherein the substrate is a core-less substrate.

Example 35 may include the device of any one of examples 24-27, wherein to create at least one opening in the second laminate layer further includes to create at least one opening having a height of at least approximately 30 microns μm and a diameter smaller than approximately 50 μm.

Example 36 may include the device of any one of examples 24-27, wherein to create at least one opening in the second laminate layer further includes to create at least one high aspect ratio opening for pin insertion.

Example 37 may include the device of any one of examples 24-27, wherein to create at least one opening in the second laminate layer further includes to create at least one pin socket.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. A method for creating a package, comprising:
    applying a first laminate layer on a side of a substrate;
    applying a seed layer to at least part of the first laminate layer;
    building up one or more copper pads on the seed layer;
    etching at least a portion of the seed layer to expose a portion of the first laminate layer;
    applying a second laminate layer to the side of the substrate, the second laminate layer to fill in around sides of at least one of the one or more copper pads and to couple with at least a portion of the exposed first laminate layer; and
    removing at least part of the built-up one or more copper pads to create at least one opening in the second laminate layer wherein the at least one opening is a high-aspect ratio opening, wherein the high-aspect ratio opening has an aspect ratio greater than 1:1 for opening depths greater than 20 micrometers (μm).

2. The method of claim 1, wherein the aspect ratio is approximately 2:1 or the aspect ratio is approximately 5:1.

3. The method of claim 1, wherein building up one or more copper pads on the seed layer includes:
    applying a dry film resist (DFR) layer or a liquid photo resist (LPR) layer to the seed layer;
    forming one or more copper pads onto the seed layer or onto an existing one or more copper pads, wherein one of the formed one or more copper pads includes an etch stop layer on a surface of the one of the formed one or more copper pads; and
    removing the one or more applied DFR layers or the one or more applied LPR layers.

4. The method of claim 1, wherein building up one or more copper pads on the seed layer includes:
    applying a DFR layer to an existing DFR layer or an LPR layer to an existing LPR layer;

forming one or more copper pads onto the seed layer or onto an existing one or more copper pads, wherein one of the formed one or more copper pads includes an etch stop layer on a surface of the one of the formed one or more copper pads; and removing the one or more applied DFR layers or the one or more applied LPR layers.

5. The method of claim 1, wherein removing at least part of the built-up one or more copper pads to expose at least one opening in the second laminate layer further includes etching the built-up one or more copper pads to an etch stop layer.

6. The method of claim 5, further comprising removing the etch stop layer.

7. The method of claim 1, wherein the first or second laminate layer is a buildup dielectric film (BUF) layer or a solder resist (SR) layer.

8. The method of claim 1, wherein the seed layer comprises a copper, tin and copper, or copper alloy film.

9. The method of claim 1, wherein the seed layer is applied through an electroless plating process or a sputter process.

10. The method of claim 1, wherein to create at least one opening in the second laminate layer further includes to create at least one opening having a height of at least approximately 30 microns μm and a diameter smaller than approximately 50 μm.

11. The method of claim 1, wherein to create at least one opening in the second laminate layer further includes to create at least one high aspect ratio opening for pin insertion.

12. A device comprising:
 means for applying a first laminate layer on a side of a substrate;
 means for applying a seed layer to at least part of the first laminate layer;
 means for building up one or more copper pads on the seed layer;
 means for etching the seed layer not covered by the one or more copper pads to expose a portion of the first laminate layer;
 means for applying a second laminate layer to the side of the substrate, the second laminate layer to fill in around the sides of at least one of the one or more copper pads and to couple with at least a portion of the exposed first laminate layer; and
 means for removing at least part of the built-up one or more copper pads to create at least one opening in the second laminate layer to create a high-aspect ratio opening with an aspect ratio greater than 1:1 for opening depths greater than 20 micrometers (μm).

13. The device of claim 12, wherein building up one or more copper pads on the seed layer includes:
 means for applying a dry film resist (DFR) layer or a liquid photo resist (LPR) layer to the seed layer;
 means for forming one or more copper pads onto the seed layer or onto an existing one or more copper pads, wherein one of the formed one or more copper pads includes an etch stop layer on the surface of the one of the formed one or more copper pads; and
 means for removing the one or more applied DFR layers or the one or more applied LPR layers.

14. The device of claim 12, wherein means for removing at least part of the built-up one or more copper pads to expose at least one opening in the second laminate layer further includes means for etching the built-up one or more copper pads to an etch stop layer.

15. The device of claim 14, further comprising means for removing the etch stop layer.

16. The device of claim 12, wherein the first or second laminate layer is a buildup dielectric film (BUF) layer or a solder resist (SR) layer.

* * * * *